United States Patent
Nicol

(10) Patent No.: US 6,282,661 B1
(45) Date of Patent: Aug. 28, 2001

(54) APPARATUS AND METHOD FOR ADAPTIVE REDUCTION OF POWER CONSUMPTION IN INTEGRATED CIRCUITS

(75) Inventor: Christopher John Nicol, West Pymble (AU)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/250,120

(22) Filed: Feb. 16, 1999

(51) Int. Cl.[7] .............................. G06F 17/10; G06F 1/26; G06F 11/00

(52) U.S. Cl. .................... 713/300; 713/322; 708/322; 714/47

(58) Field of Search ................................ 713/300, 322, 713/320; 708/300, 322; 323/318; 714/47, 48, 799, 819

(56) References Cited

U.S. PATENT DOCUMENTS

| | | | |
|---|---|---|---|
| 5,307,003 | * | 4/1994 | Fairbanks et al. . |
| 5,734,598 | | 3/1998 | Abbott et al. . |
| 5,777,914 | | 7/1998 | Larsson et al. . |
| 5,926,640 | * | 7/1999 | Mason et al. . |
| 6,078,209 | * | 6/2000 | Linoff . |

FOREIGN PATENT DOCUMENTS

| | | |
|---|---|---|
| 0505884A | 9/1992 | (EP) . |
| 0700171A2 | 3/1996 | (EP) . |

OTHER PUBLICATIONS

J. Goodman et al., "An Energy/Security Scalable Encryption Processor Using an Embedded Variable Voltage DC/DC Coverter", ISSCC98, 1998.

Z. Kostic, "Digital Signal Ptocessors in Cellular Radio Communications", IEEE Communications Magazine, Dec. 1997, pp. 22–35.

K. Suzuki et al., "A 300MIPS/W RISC Core Processor with Variable Supply–Voltage Scheme in Variable Threshold–Voltage CMOS", IEEE Custom Integrated Circuits Conference, 1997, pp. 587–590.

C. J. Nicol et al., "A Low–Power 128–Tap Digital Adaptive Equalizer for Broadband Modems", IEEE Journal of Solid State Circuits, vol. 32, No. 11, Nov. 1997, pp. 1777–1789.

J. T. Ludwig et al., "Low Power Filtering Using Approximate Processing For DSP Applications", IEEE 1995 Custom Integrated Circuits Conference, pp. 185–188.

(List continued on next page.)

*Primary Examiner*—Gopal C. Ray

(57) ABSTRACT

Power consumption in program implemented circuits and the like is dynamically controlled in accordance with the circuit performance over time, not by reducing switched capacitance as was done in prior hardware circuit implementations but, in accordance with the invention, by dynamically reducing the number of machine cycles required to implement the desired circuit at an acceptable performance level. Power consumption is dynamically reduced in program implemented circuits, for example, circuits implemented on a digital signal processor (DSP), including filters employed for channel equalization and for echo cancellation by monitoring the circuit performance over time and dynamically scaling back filter parameters when less than worst case performance is required. Scaling back of the DSP implemented filter parameters results in fewer machine cycles being required to effect the filters while maintaining adequate performance that, in turn, allows reduction in the DSP clock frequency, resulting in lower power consumption. The reduced DSP clock frequency also allows the DSP to be operated at a lower supply voltage that yields significant additional power savings.

33 Claims, 3 Drawing Sheets

OTHER PUBLICATIONS

G. Wei, "A Low Power Switching Power Supply for Self–Clocked Systems", ISLPED96 Conference Proceedings, Aug. 1996, pp. 313–317.

W. Namgoong, "A High–Efficiency Variable Voltage CMOS Dynamic dc–dc Switching Regulator", ISSCC97, Feb. 1997, pp. 380–381.

P. Larsson et al., "Self–Adjusting Bit–Precision for Low–Power Digital Filters", 1997 Symposium on VLSI Circuits Digest of Technical Papers, 1997, pp. 123–124.

P. Lapsley et al., "DSP Processor Fundamentals", IEEE Press, New York, N. Y., 1997, pp. 1–7.

* cited by examiner

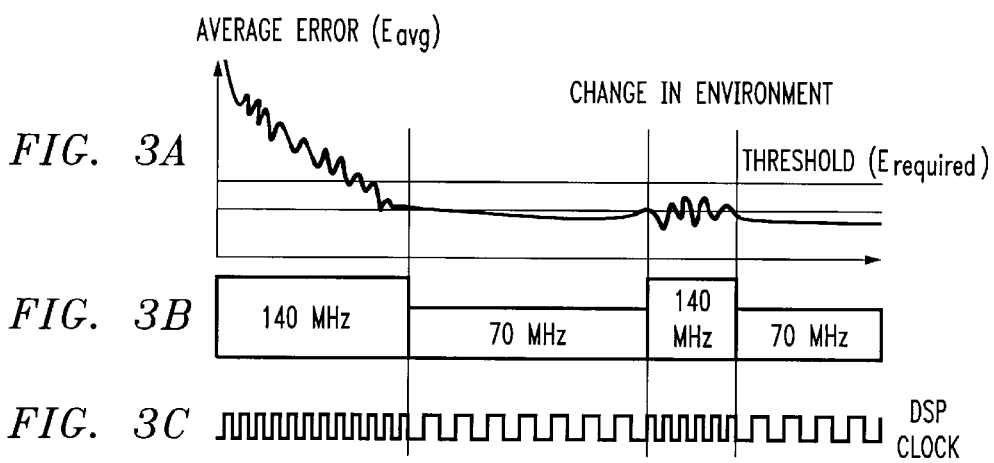
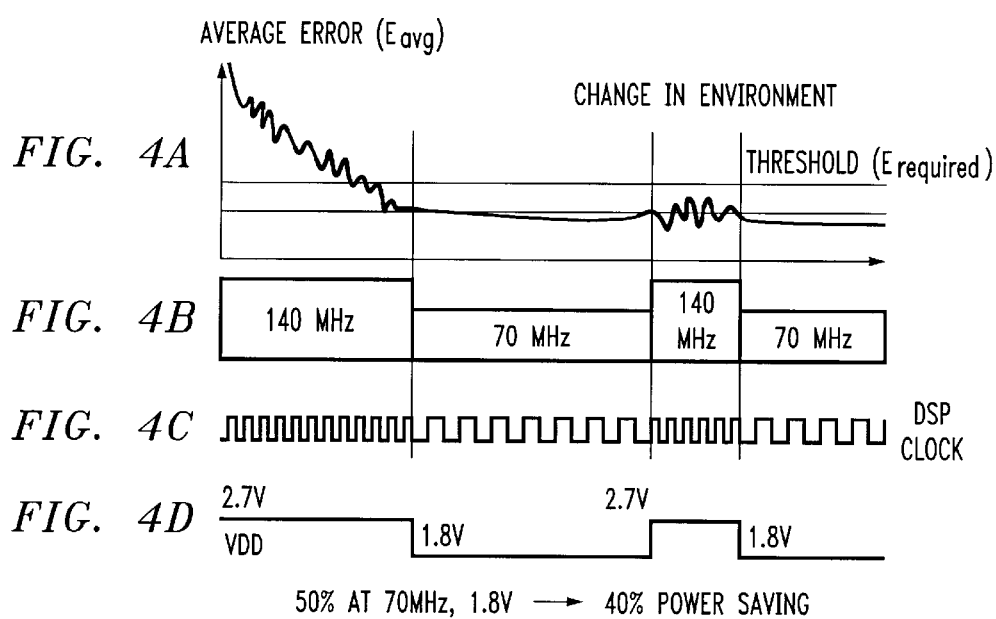

APPARATUS AND METHOD FOR ADAPTIVE REDUCTION OF POWER CONSUMPTION IN INTEGRATED CIRCUITS

TECHNICAL FIELD

This invention relates to dynamically reducing power consumption in integrated circuits and, more particularly, in digital signal processors or the like.

BACKGROUND OF THE INVENTION

General-purpose digital signal processors (DSPs) are used in low cost/low power applications, for example, in modems. Such modems implement more than a single protocol and as such employ software processes to implement these protocols on a programmable DSP. There is a trend in industry to move more of the processing in modem applications into the digital domain from the analog domain. This trend involves doing much of the signal processing in software on a general-purpose DSP core. The advantages of this approach are reduced size and cost resulting from increased levels of integration. Such integration minimizes the number of passive components and increases the number of protocols that can be implemented in a single implementation. However, the power consumption of the programmable DSP core dominates the power consumption of the modem and, therefore, becomes a critical design issue, especially for battery operated portable applications.

DSPs typically spend much of their operating cycles performing multiply-accumulate (MAC) operations to implement filters and these operations dominate the power consumption. The protocols being implemented are always defined in terms of a worst-case operating environment. This includes a worst-case model of the communication channel including worst-case interference, temperature, echo, etc. A model of this environment is used to determine the amount of digital signal processing that is needed to realize a required bit-error-rate for the modem being implemented. Any modem implementation must provide at least this level of performance.

It is well known that much of the DSP complexity in a modem, i.e., the operations that require the most machine cycles to implement, is in implementing the filters in the modem receiver for channel equalization and echo cancellation. The specifications of these filters, for example, A/D precision, number of taps, precision of taps, update algorithm, adaptation rate, etc., are set by the characteristics of the worst-case model of the channel.

Some studies have suggested that the specifications of the filters in hardware implementations can be relaxed in non-worst-case operating environments. For example, U.S. Pat. No. 5,777,914 to C. J. Nicol et al. discloses a hardware arrangement that monitors the signal to noise performance of an adaptive filter over a period of time to yield an average error value. This average error value is used to "scale-back" the precision of the filter tap coefficients in an adaptive manner that, in turn, reduces the power consumption in the filter because the filter response is represented with fewer bits. The signal to noise performance of the filter is reflected in the error used to update the filter coefficients. If the error is very small, the update rate can be reduced without impacting the receiver performance. See an article by C. J. Nicol et al. entitled "A low power 128-tap digital adaptive equalizer for broadband modems", *IEEE Journal of Solid State Circuits*, Vol. 32, No. 11, November 1997, pp. 1777–1789. Furthermore, the number of taps in the filter can be reduced to reduce the number of multiplications required for equalization. See an article by J. T. Ludwig et al. entitled "Low power filtering using approximate processing for DSP applications", *IEEE 1995 Custom Integrated Circuits Conference*, pp. 185–188. Although these techniques have been used for filter implementations in hardware, it has historically made little or no sense to use them in software modem implementations because the programmable DSP operates at a fixed frequency and provides adequate performance to implement the worst-case protocol. Indeed, in hardware implementations, the objective of these adaptive techniques is to minimize switching capacitance to reduce power.

SUMMARY OF THE INVENTION

Power consumption in program implemented circuits and the like is dynamically controlled in accordance with the circuit performance over time, not by reducing switched capacitance as was done in prior hardware circuit implementations but, in accordance with the invention, by dynamically reducing the number of machine cycles required to implement the desired circuit at an acceptable performance level.

Power consumption is dynamically reduced in program implemented circuits, for example, circuits implemented on a DSP, that include filters employed for channel equalization and for echo cancellation. This reduction in power usage results from monitoring the circuit performance over time and dynamically scaling back filter parameters during intervals that less than worst case performance is required. Scaling back of the DSP implemented filter parameters results in fewer machine cycles being required to effect the filters while maintaining adequate performance that, in turn, allows reduction in the DSP clock frequency, resulting in lower power consumption. The reduced DSP clock frequency also allows the DSP to be operated at a lower supply voltage that yields significant additional power savings.

BRIEF DESCRIPTION OF THE DRAWING

FIGS. 4A through 4D graphically illustrate information useful in describing operation of another embodiment of the invention.

DETAILED DESCRIPTION

Figure 1:
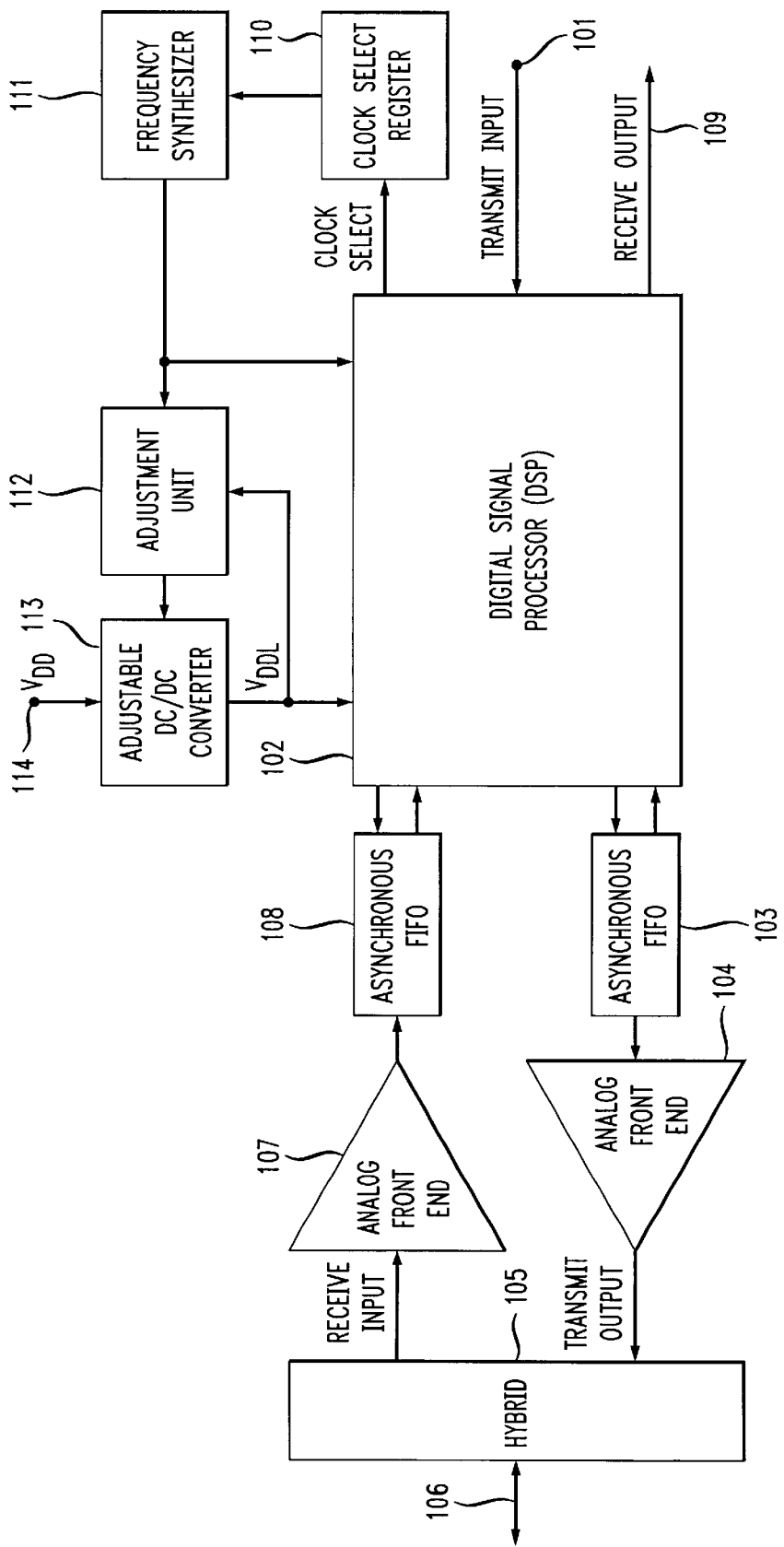
FIG. 1 shows, in simplified block diagram form, details of a modem including an embodiment of the invention.

FIG. 1 shows, in simplified block diagram form, details of a modem including an embodiment of the invention. In this example, FIG. 1 depicts a modem for transmitting and receiving data signals in now well known fashion. To this end, data bits are supplied via transmit input 101 to digital signal processor (DSP) 102. DSP 102 may be any of such digital signal processors now commercially available, for example, the DSP16210 commercially available from Lucent Technologies Inc. DSP 102 is programmed to implement the desired modem functions and be arranged to implement many modem protocols. Typically, the functions programmed in DSP 102 are those employed in the latest modems and may include but are not limited to a scrambler, encoder, mapper, modulator, transmit filter, receive filter, one or more "typical" echo cancelers, one or more so-called NEXT echo cancelers if needed for the application, receive filter, variable phase interpolator, adaptive equalizer, slicer, decision feedback equalizer (DFE), demapper, decoder and descrambler. It should be noted that the adaptive echo cancelers and adaptive equalizers typically are implemented by employing adaptive finite impulse response (FIR) filters. The FIR filters are adaptive transversal filters of a type now well known in the art.

It should be noted that the operations in a DSP implemented modem that require the most machine cycles to implement are in the adaptive filters in the receiver equalizer(s) and echo canceler(s). The parameters of these filters, for example, A/D precision, number of taps, precision of taps, updating the tap weights, update process, adaptation rate, etc., are set by the characteristics of a worst-case model of the communications channel, e.g., telephone line, over which the data is to be transported. I have discovered that by dynamically scaling back these parameters in the programmed process from those needed for worst-case operation, power consumption in the DSP is significantly reduced. Again, this parameter scaling back approach reduces the number of DSP machine cycles required that, in turn, allows the DSP clock frequency to be reduced and, finally allows the DSP supply voltage to be deceased in value. All of these factors cause a significant reduction in the power consumed by the DSP in implemented the modem.

As indicated above, data to be transmitted is supplied as data bits via transmit input 101 to DSP 102. DSP 102 operates on the data bits to generate blocks of data encoded and modulated into the format of the particular protocol being utilized. These blocks of data are in the form of a real data signal and are supplied as needed to asynchronous FIFO (first in first out) register 103. Thus, the bit rate from DSP 102 to FIFO 103 is variable, while the bit rate from FIFO 103 to analog front end unit 104 is constant. Note that any type memory equivalent to FIFO 103 may equally be employed. Analog front end 104 converts the data signal to an analog version that is supplied to communications channel 106, e.g., a telephone line, via hybrid 105. Communications channel 106 supplies the analog data signal to a remote modem.

An analog data signal received via communications channel 106 is supplied via hybrid 105 at a constant bit rate to analog front end 107 where it is converted to digital form and supplied at a constant bit rate to asynchronous FIFO 108. The received data is supplied as needed, i.e., at a variable bit rate, to DSP 102 and, therein, to the implemented modem receiver section. This variable bit rate is necessary because the DSP clock frequency is being varied in accordance with the invention. The modem implemented by DSP 102 yields a demapped, decoded and descrambled bit stream at receive output 109. Again, DSP 102 is programmed to perform the functions of the particular modem protocol being implemented. Such programmed DSP modem arrangements are well known in the art. (See for example, P. Lapsley et al., *DSP Processor Fundamentals, Architecture and Features*, IEEE Press, New York, N.Y., 1997.) In its operation of dynamically scaling back performance of the modem (e.g., adaptive filters), the clock frequency of DSP 102 may be changed as explained below in conjunction with FIGS. 2, 3A–3C and 4A–4D. To this end, DSP 102 under programmed control generates a clock select signal that is supplied to and stored in clock select register 110. In turn, the clock select signal is supplied to adjust frequency synthesizer 111 to the desired DSP clock frequency. Frequency synthesizer is, for example, in phase looked loop including a controllable oscillator. Frequency synthesizer 111 is responsive to the clock select signal to generate a corresponding output clock signal in well known fashion. The clock signal output from frequency synthesizer 111 is supplied to a clock input of DSP 102 and to adjustment unit 112. Adjustment unit 112 is responsive to the clock signal output from synthesizer 111 and to the adjusted supply voltage $V_{DDL}$ to generate a control signal for controlling adjustable DC/DC converter 113 to adjust the value of supply voltage $V_{DD}$ being supplied to DSP 102 and adjustment unit 112, namely, $V_{DDL}$. Such adjustment units as 112 and controllable DCIDC converters like 113 are known in the art. (For one example, see an article entitled "A 300MIPS/W RISC Core Processor with Variable Supply-Voltage Scheme in Variable Threshold-Voltage CMOS", *IEEE* 1997 *Custom Integrated Circuits Conference*, 1997, pp. 587–590.)

Figure 2:
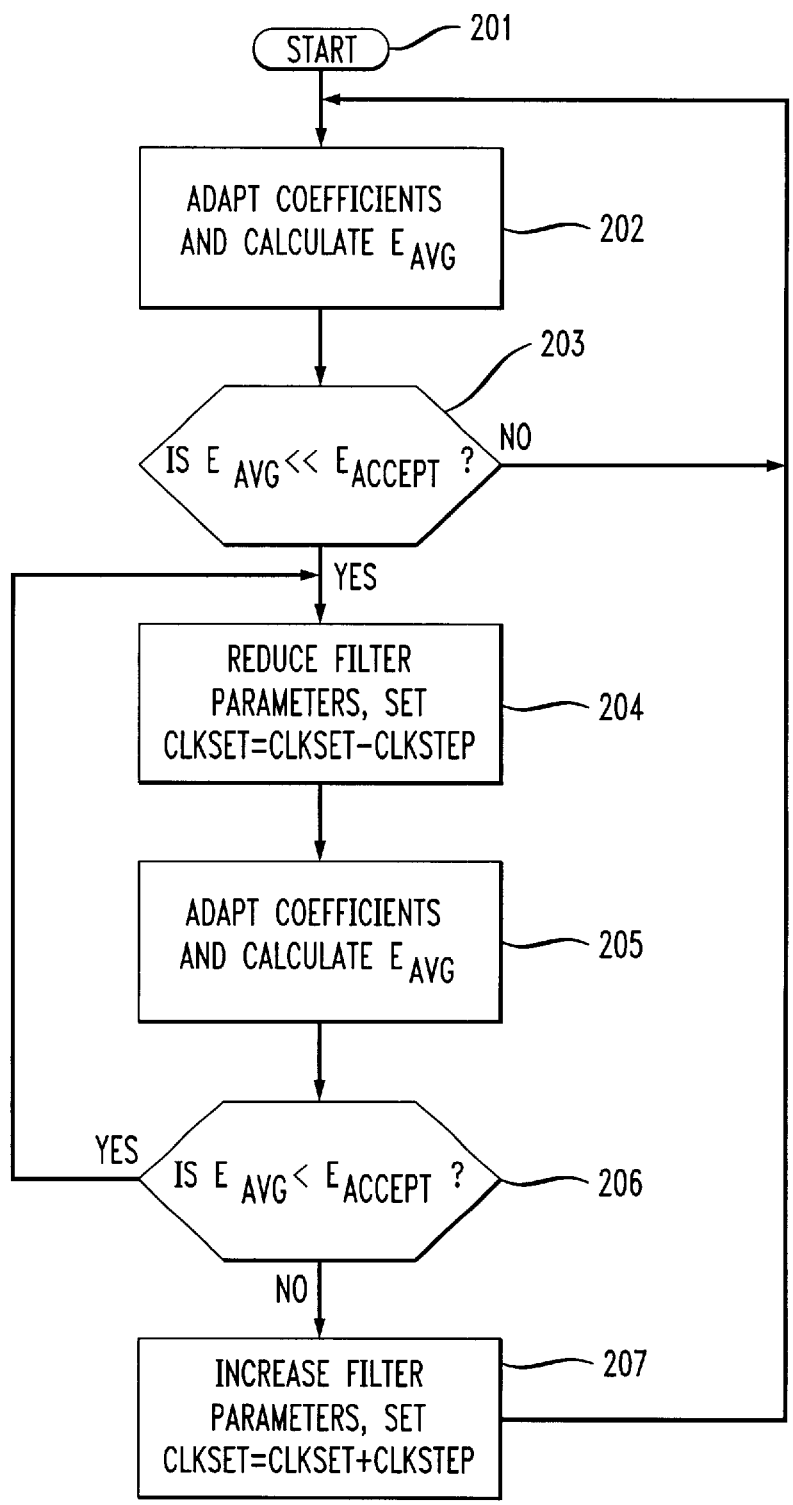
FIG. 2 is a flowchart illustrating steps in a process implementing an embodiment of the invention, FIGS. 3A through 3C graphically illustrate information useful in describing the operation of an embodiment of the invention.

It should be noted that the adaptive filters in the equalizers and echo cancelers employed in the modem implementation employ error signals in their adaptation process. These error signals can advantageously be employed to dynamically scale back the filter parameters so that, in turn, the DSP clock frequency may be reduced in accordance with the invention. The steps utilized in effecting the dynamic scaling back of the filter parameters are shown in the flowchart of FIG. 2. The process of FIG. 2 is best explained in conjunction with a specific example, which is by way of an example only and not intended to limit the scope of the invention.

To this end, reference is made to FIGS. 3A through 3C, which graphically illustrate information useful in describing the operation of a specific embodiment of the invention in which the number taps employed in the filter utilized in an adaptive equalizer in the receiver section of the modem are dynamically scaled back. FIG. 3A shows the magnitude of the equalizer error signal over time, FIG. 3B shows the DSP clock frequency and number of equalizer filter taps being employed at the DSP clock frequency, and FIG. 3C shows the variation in the DSP clock frequency. Again, the purpose of this embodiment of the invention, is to scale back the DSP performance required by the modem being implemented, so that the DSP implementing the software to realize the modem can be operated at a reduced DSP clock frequency than that required for worse-case operation while still realizing an adequate bit-error-rate required by the application. For example, a FIR filter having 100 taps may perform 10 operations per tap per cycle, thus requiring 1000 DSP cycles. If the same performance, i.e., bit-error-rate, can be realized by employing only 50 taps, the number of DSP cycles is cut in half However, the programmed process now has twice as long to complete its functionality. Consequently, the DSP clock frequency can be cut in half. Referring to FIG. 3A, it is seen that initially the error is large while the filter is being trained. Thus, during this training interval the maximum available filtering performance is used, i.e., 100 taps as shown in FIG. 3B. As the filter converges, the average error is reduced where the parameters, i.e., taps, of the programmed filtering process is scaled back to use, for example, 50 taps. For the DSP to compute the filter for each data sample now only requires 500 DSP cycles and, consequently, the DSP clock frequency can be reduced so that the reduced filter computation takes the same time interval that the 100 tap filter required. Indeed, while the error remains small, the filter tap updating may be shut down so that the number of DSP cycles is further reduced to 250 cycles to complete the filter computation for each data sample. This, in turn, allows a further reduction in the DSP clock frequency by cutting it in half again. The error continues to be monitored and when a change occurs that requires higher filter performance, for example, worse-case, as reflected by an increase in the error, the number of taps employed are rapidly increased to the maximum number, in this example, 100 taps.

Referring to FIG. 2 there is shown a flowchart illustrating steps in a process implementing scaling back of DSP 102 performance in an embodiment of the invention. In this example, not to be construed as limiting the scope of the invention the parameters of the modem receiver adaptive equalizer FIR filter are being adjusted and, specifically, the number of filter taps. Thus, the process is started in step 201. Note that initially the filter parameters and the DSP clock frequency are set at prescribed maximum values. Thereafter, step 202 causes the filter coefficients to be adapted and the average filter error ($E_{AVG}$) to be calculated. Then, step 203 tests to determine if $E_{AVG}$ is very much less than an acceptable error ($E_{ACCEPT}$), namely, $E_{AVG} << E_{ACCEPT}$. If the test result in step 203 is NO, control is returned to step 202 and steps 202 and 203 are iterated until step 203 yields a YES result. Control is transferred to step 204 and the filter parameters, i.e., in this example, the number of filter taps, are reduced and the DSP 102 clock frequency is adjusted, namely, by setting CLKSET=CLKSET−CLKSTEP. Where CLKSTEP is a prescribed frequency step determined for the particular application being implemented. Then, step 205 causes the filter coefficients to be adapted and the average filter error ($E_{AVG}$) to be calculated. Then, step 206 tests to determine if $E_{AVG}$ is less than an acceptable error ($E_{ACCEPT}$), namely, $E_{AVG} < E_{ACCEPT}$. If test the result in step 203 is YES, steps 204, 205 and 206 are iterated until step 206 yields a NO result. Then, step 207 causes and the filter parameters, i.e., in this example, the number of filter taps, are reduced and the clock frequency of DSP 102 is adjusted, namely, by setting CLKSET=CLKSET+CLKSTEP and control is returned to step 202. Thereafter, appropriate ones of steps 202 through steps 207 are repeated as required. The above DSP clock frequency adjustment process employs a so-called two tiered error threshold procedure. That is, the filter coefficients are allowed to first adapt until $E_{AVG} << E_{ACCEPT}$. Then, the filter parameters are dynamically scaled back and the DSP clock frequency reduced by setting CLKSET=CLKSET−CLKSTEP until $E_{AVG}$ is not less than $E_{ACCEPT}$ as determined by the test in step 206. Then, the filter parameters are dynamically increased and the DSP 102 clock frequency increased by setting CLKSET= CLKSEFT−CLKSTEP in step 207. The filter coefficients are allowed to adapt again until $E_{AVG} << E_{ACCEPT}$ and the adjustment process is repeated by iterating steps 202 through 207 as required. It should be noted that the DSP clock frequency may be adjusted in prescribed steps. For example, in an implementation having a worst case DSP clock frequency of 140 MHz, the DSP clock frequency may be adjusted in 5 MHz steps. Thus, the DSP clock frequency is decremented by a prescribed step value (CLKSTEP) while $E_{AVG} < E_{ACCEPT}$ and, then, incremented by the prescribed frequency step value (CLKSTEP) when $E_{AVG}$ is not less than $E_{ACCEPT}$.

The pseudo-code for the above DSP clock frequency adjustment process shown in the flowchart of FIG. 2 is as follows:

```
set Eaccept   /* Eaccept = error acceptable to application */
set filter parameters to maximum
set DSP clock frequency to maximum
```

```
loop {
    adapt coefficients until converged
    calculate Eavg          /* Eavg = average error */
    if (Eavg << Eaccept) {
        while (Eavg < required) {
            reduce filter parameters
            reduce DSP clock frequency
            adapt coefficients until converged
            calculate Eavg
        }
        increase filter parameters
        increase DSP clock frequency
    }
}
```

Note that performance parameters of all the adaptive filters in the DSP implemented modem may be adjusted. For example, if the echo is not too bad, the parameters of the adaptive filter employed in the echo canceler can be scaled back. If the modem employs the so-called NEXT echo cancelers their filters may also be scaled back. Note that "NEXT" denotes "near-end cross talk". The scaling back may be done simultaneously or sequentially. Indeed, parameters other than the number of taps may also be adjusted, for example, the filter tap weights, adaptation rate, among others.

In this example, FIGS. 4A through 4D show the relationship of the error to scaling back the number of filter taps and DSP clock frequency and, additionally, the scaling back of the supply voltage $V_{DD}$ to yield adjusted supply voltage $V_{DDL}$. To this end, FIGS. 4A through 4C are identical to FIGS. 3A through 3C described above and will not be described again. Thus, FIG. 4D shows the adjusted supply voltage $V_{DDL}$ being scaled back from a prescribed value, for example, from 2.7 volts to 1.8 volts, then increased to 2.7 volts and, again, scaled back to 1.8 volts as the DSP clock frequency is scaled back from 140 MHz to 70 MHz, increased back to 140 MHz and, then, scaled back to 70 MHz, respectively. Note that although FIG. 4D shows an abrupt change in the adjusted supply voltage $V_{DDL}$, in this example, it is adjusted at the 5 MHz step value, which could occur very rapidly.

What is claimed is:

1. A method for use in a programmed circuit arrangement intended to operate at a prescribed clock frequency, the method comprising the steps of:
   comparing a performance error value to a prescribed error threshold value and as a result adjusting circuit performance parameters in accordance with prescribed criteria, including
   scaling back said circuit performance parameters when said performance error value is less than said error threshold value; and
   adjusting said circuit clock frequency in prescribed relationship to said adjusted circuit performance parameters, including
   reducing said circuit clock frequency in response to said scaled back circuit performance parameters,
   whereby power consumption of said circuit is dynamically reduced.

2. A method as defined in claim 1 wherein the circuit is powered by a supply voltage having a prescribed value and further including the step of adjusting said supply voltage value in response to said adjusted circuit clock frequency.

3. A method as defined in claim 1 wherein the circuit is powered by a supply voltage having a prescribed value and further including the step of reducing said supply voltage value in response to said reduced circuit clock frequency.

4. A method for use in a digital signal processor including a program implemented circuit, the digital signal processor being intended to operate at a prescribed clock frequency, the program implemented circuit having at least one adaptive filter including a plurality of filter parameters and generating an error signal value, the method comprising the steps of:

comparing the error signal value to a prescribed performance error threshold value and as a result adjusting said adaptive filter parameters in accordance with prescribed criteria, including scaling back said adaptive filter parameters when said error signal value is less than said error threshold value; and adjusting said digital signal processor clock frequency in prescribed relationship to said adjusted adaptive filter parameters, including reducing said digital signal processor clock frequency in response to said scaled back adaptive filter parameters, whereby power consumption of said digital signal processor is dynamically reduced.

5. A method as defined in claim 4 wherein the digital signal processor is powered by a supply voltage having a prescribed value and further including the step of adjusting said supply voltage value in response to said adjusted digital signal processor clock frequency.

6. A method as defined in claim 4 wherein the digital signal processor is powered by a supply voltage having a prescribed value and further including the step of reducing said supply voltage value in response to said reduced digital signal processor clock frequency.

7. A method as defined in claim 6 wherein said adaptive filter parameters are filter taps and wherein said digital signal processor frequency is reduced in steps until said step of comparing indicates that said error signal value is less than said error threshold value.

8. A method as defined in claim 6 wherein said adaptive filter parameters are tap weights and wherein said digital signal processor frequency is reduced in steps until said step of comparing indicates that said error signal value is less than said error threshold value.

9. A method as defined in claim 6 wherein said adaptive filter parameters are an adaptation rate and wherein said digital signal processor frequency is reduced in steps until said step of comparing indicates that said error signal value is less than said error threshold value.

10. A method as defined in claim 6 wherein said program implemented circuit includes at least one program implemented adaptive echo canceler including said adaptive filter.

11. A method as defined in claim 6 wherein said program implemented circuit includes at least one program implemented adaptive equalizer including said adaptive filter.

12. Apparatus for use in a programmed circuit arrangement intended to operate at a prescribed clock frequency, the apparatus comprising:

a comparator for comparing a generated performance error value to a prescribed error threshold value and as a result adjusting adjustable performance parameters of said program implemented circuit in accordance with prescribed criteria, including scaling back said adjustable circuit performance parameters when said performance error value is less than said error threshold value; and a circuit clock having an adjustable frequency that is adjusted in prescribed relationship to said adjusted circuit performance parameters, including reducing said circuit clock frequency in response to said scaled back circuit performance parameters, whereby power consumption of said circuit is dynamically reduced.

13. The invention as defined in claim 12 further including an adjustable supply voltage source having a prescribed supply voltage value for powering said program implemented circuit and being responsive to said adjusted circuit clock frequency for adjusting said supply voltage value.

14. The invention as defined in claim 12 further including an adjustable source of supply voltage having a prescribed value and being responsive to said reduced circuit clock frequency to reduce said supply voltage value.

15. Apparatus for use in a digital signal processor including a program implemented circuit intended to operate at a prescribed digital signal processor clock frequency, the program implemented circuit having at least one adaptive filter including a plurality of filter parameters and generating an error signal value, the apparatus comprising:

a comparator for comparing the error signal value to a prescribed performance error threshold value and as a result adjusting said adaptive filter parameters in accordance with prescribed criteria, including scaling back said adaptive filter parameters when said error signal value is less than said error threshold value; and a digital signal processor clock having an adjustable frequency that is adjusted in prescribed relationship to said adjusted adaptive filter parameters, including reducing said digital signal processor clock frequency in response to said scaled back adaptive filter parameters, whereby power consumption of said digital signal processor is dynamically reduced.

16. The invention as defined in claim 15 further including an adjustable supply voltage source for supplying a prescribed supply voltage value to said digital signal processor and being responsive to said adjusted digital signal processor clock frequency for adjusting said supply voltage value.

17. The invention as defined in claim 15 further including an adjustable supply voltage source for supplying a prescribed supply voltage value to said digital signal processor and being responsive to said adjusted digital signal processor clock frequency for adjusting said supply voltage value.

18. The invention as defined in claim 17 wherein said adaptive filter parameters are filter taps and wherein said digital signal processor clock frequency is reduced in steps until said result of comparing indicates that said error signal value is less than said error threshold value.

19. The invention as defined in claim 17 wherein said adaptive filter parameters are tap weights and wherein said digital signal processor clock frequency is reduced in steps until said result of comparing indicates that said error signal value is less than said error threshold value.

20. The invention as defined in claim 17 wherein said adaptive filter parameters are an adaptation rate and wherein said digital signal processor clock frequency is reduced in steps until said result of comparing indicates that said error signal value is less than said error threshold value.

21. The invention as defined in claim 17 wherein said program implemented circuit includes at least one program implemented adaptive echo canceler including said adaptive filter.

22. The invention as defined in claim 17 wherein said program implemented circuit includes at least one program implemented adaptive equalizer including said adaptive filter.

23. Apparatus for use in a programmed circuit arrangement intended to operate at a prescribed clock frequency, the apparatus comprising:

means for comparing a generated performance error value to a prescribed error threshold value and as a result adjusting adjustable performance parameters of said programmed circuit arrangement in accordance with prescribed criteria, including means for scaling back said circuit performance parameters when said performance error value is less than said error threshold value; and means for generating a circuit clock having an adjustable frequency that is adjusted in prescribed relationship to said adjusted circuit performance parameters, including means for reducing said frequency in response to said scaled back circuit performance parameters, whereby power consumption of said circuit is dynamically reduced.

24. The invention as defined in claim 23 further including means for supplying an adjustable supply voltage having a prescribed supply voltage value for powering said program implemented circuit and being responsive to said adjusted circuit clock frequency for adjusting said supply voltage value.

25. The invention as defined in claim 23 further including means for supplying an adjustable source of supply voltage having a prescribed value and being responsive to said reduced circuit clock frequency to reduce said supply voltage value.

26. Apparatus for use in a digital signal processor including a program implemented circuit intended to operate at a prescribed digital signal processor clock frequency, the program implemented circuit having at least one adaptive filter including a plurality of adaptive filter parameters and generating an error signal value, the apparatus comprising:

means for comparing the error signal value to a prescribed performance error threshold value and as a result adjusting said adaptive filter parameters in accordance with prescribed criteria, including means for scaling back said adaptive filter parameters when said error signal value is less than said error threshold value; and means for (generating a digital signal processor clock having an adjustable frequency that is adjusted in prescribed relationship to said adjusted adaptive filter parameters, including means for reducing said digital signal processor clock frequency in response to said scaled back adaptive filter parameters, whereby power consumption of said digital signal processor is dynamically reduced.

27. The invention as defined in claim 26 further including means for supplying an adjustable supply voltage source having a prescribed supply voltage value to said digital signal processor and being responsive to said adjusted digital signal processor clock frequency for adjusting said supply voltage value.

28. The invention as defined in claim 26 further including means for supplying an adjustable supply voltage source having a prescribed supply voltage value to said digital signal processor and being responsive to said adjusted digital signal processor clock frequency for adjusting said supply voltage value.

29. The invention as defined in claim 28 wherein said adaptive filter parameters are filter taps and wherein said digital signal processor clock frequency is reduced in steps until said result of comparing indicates that said error signal value is less than said error threshold value.

30. The invention as defined in claim 28 wherein said adaptive filter parameters are tap weights and wherein said digital signal processor clock frequency is reduced in steps until said result of comparing indicates that said error signal value is less than said error threshold value.

31. The invention as defined in claim 28 wherein said adaptive filter parameters arc an adaptation rate and wherein said digital signal processor clock frequency is reduced in steps until said result of comparing indicates that said error signal value is less than said error threshold value.

32. The invention as defined in claim 28 wherein said program implemented circuit includes at least one program implemented adaptive echo canceler including said adaptive filter.

33. The invention as defined in claim 28 wherein said program implemented circuit includes at least one program implemented adaptive equalizer including said adaptive filter.

\* \* \* \* \*